(12) United States Patent
Chen

(10) Patent No.: US 11,233,136 B2
(45) Date of Patent: Jan. 25, 2022

(54) SILICON CARBIDE OXIDE HARD MASK FOR REDUCING DISHING EFFECTS

(71) Applicant: Taiwan Semiconductor Manufacturing Co., Ltd., Hsinchu (TW)

(72) Inventor: Yi-Lun Chen, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/937,252

(22) Filed: Jul. 23, 2020

(65) Prior Publication Data

US 2021/0193817 A1 Jun. 24, 2021

Related U.S. Application Data

(60) Provisional application No. 62/951,833, filed on Dec. 20, 2019.

(51) Int. Cl.
*H01L 21/308* (2006.01)
*H01L 29/66* (2006.01)
(Continued)

(52) U.S. Cl.
CPC ...... *H01L 29/6656* (2013.01); *H01L 21/3086* (2013.01); *H01L 21/311* (2013.01);
(Continued)

(58) Field of Classification Search
CPC ... H01L 21/308; H01L 21/311; H01L 21/768; H01L 21/764; H01L 21/3086; H01L 21/76897; H01L 21/31144; H01L 21/76289; H01L 21/7682; H01L 21/76264; H01L 21/8234; H01L 21/8238; H01L 21/823418; H01L 21/823425; H01L 21/823814; H01L 21/823475; H01L 21/823871; H01L 21/28132; H01L 21/2815; H01L 21/823468; H01L 21/823864; H01L 21/823878; H01L 21/823821; H01L 21/823828; H01L 21/82385; H01L 21/823892; H01L 21/845; H01L 21/823431; H01L 29/06;
(Continued)

(56) References Cited

U.S. PATENT DOCUMENTS

2009/0023279 A1* 1/2009 Kim ............... H01L 21/764
438/594
2018/0130899 A1* 5/2018 Zhang ............ H01L 29/7851
(Continued)

*Primary Examiner* — Chuong A Luu
(74) *Attorney, Agent, or Firm* — Sterne, Kessler, Goldstein & Fox P.L.L.C.

(57) ABSTRACT

The present disclosure relates to a semiconductor device that includes a first terminal formed on a fin region and having a first spacer. The semiconductor device further includes a second terminal having a hard mask and a second spacer opposing the first spacer. The hard mask and the second spacer are formed using different materials. The semiconductor device also includes a seal layer formed between first and second spacers of the first and second terminals, respectively. The semiconductor device further includes an air gap surrounded by the seal layer, the fin region, and the first and second spacers.

20 Claims, 11 Drawing Sheets

(51) Int. Cl.
    *H01L 21/311*     (2006.01)
    *H01L 29/06*     (2006.01)
    *H01L 29/49*     (2006.01)
    *H01L 21/768*     (2006.01)

(52) U.S. Cl.
    CPC .... *H01L 21/76897* (2013.01); *H01L 29/0649* (2013.01); *H01L 29/4991* (2013.01); *H01L 29/66795* (2013.01)

(58) Field of Classification Search
    CPC ....... H01L 29/51; H01L 29/66; H01L 29/515; H01L 29/518; H01L 29/417; H01L 29/4991; H01L 29/41725; H01L 29/7839; H01L 29/806; H01L 29/6653; H01L 29/66553; H01L 29/6656; H01L 29/66689; H01L 29/66719; H01L 29/4983; H01L 29/28132; H01L 29/2815; H01L 29/0843; H01L 29/0891; H01L 29/0649; H01L 29/66795; H01L 29/49; H01L 29/78; H01L 29/08; H01L 29/785; H01L 29/0847
    USPC .......................................................... 438/299
    See application file for complete search history.

(56) References Cited

U.S. PATENT DOCUMENTS

| | | | |
|---|---|---|---|
| 2018/0138279 A1* | 5/2018 | Xie | H01L 29/4991 |
| 2020/0083349 A1* | 3/2020 | Bao | H01L 29/66545 |
| 2021/0066489 A1* | 3/2021 | Xie | H01L 29/785 |

* cited by examiner

SILICON CARBIDE OXIDE HARD MASK FOR REDUCING DISHING EFFECTS

This application claims the benefit of U.S. Provisional Patent Application No. 62/951,833, titled "Silicon Carbide Oxide Hard Mask for Reducing Dishing Effects," which was filed on Dec. 20, 2019 and is incorporated herein by reference in its entirety.

BACKGROUND

The semiconductor integrated circuit (IC) industry has experienced exponential growth. Technological advances in IC materials and design have produced generations of ICs, where each generation has smaller and more complex circuits than the previous generation. In the course of the IC evolution, functional density (e.g., the number of interconnected devices per chip area) has increased while geometry size (e.g., the smallest component or line that can be created using a fabrication process) has decreased. This scaling process provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
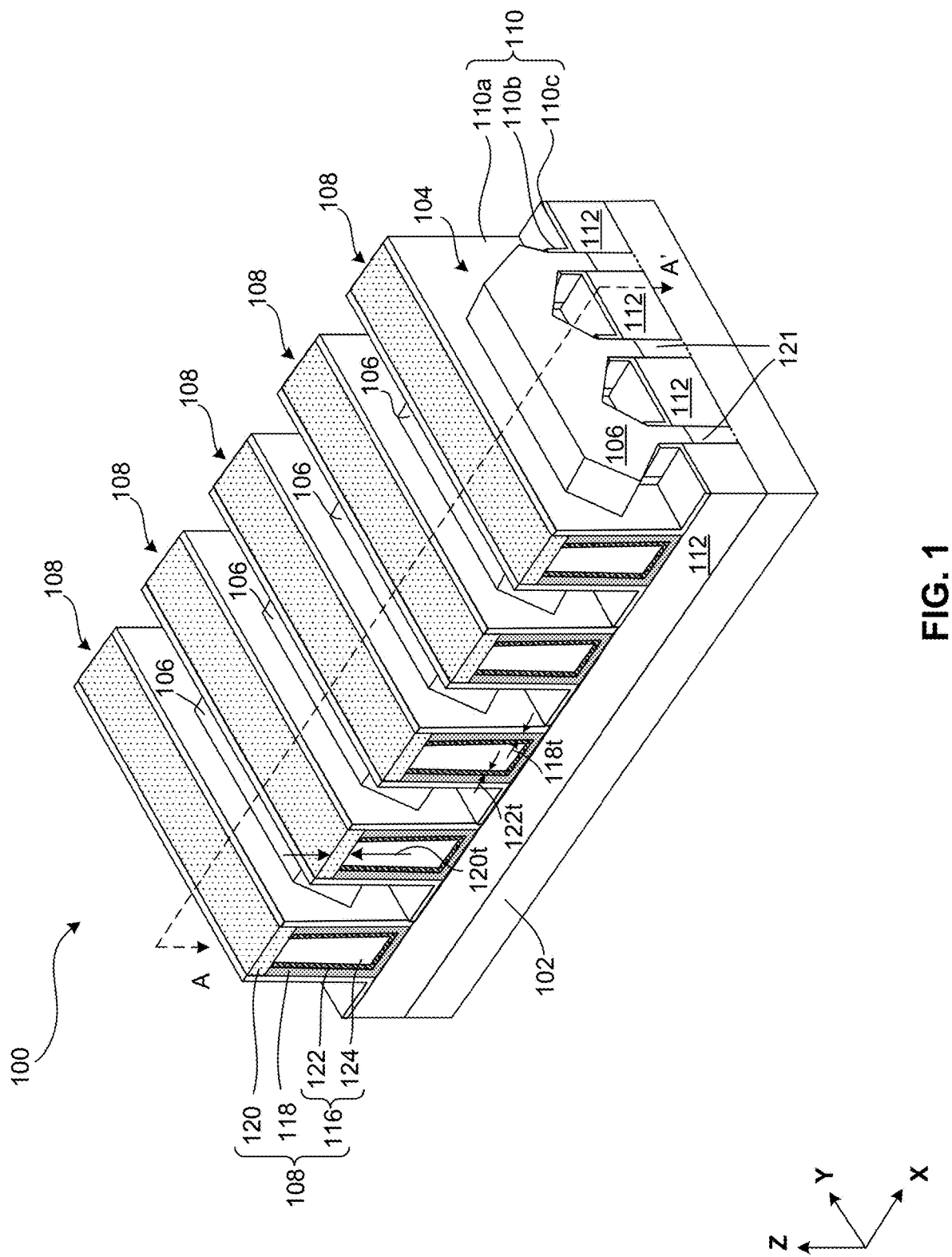
FIG. 1 is an isometric view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in physical contact, and may also include embodiments in which additional features are disposed between the first and second features, such that the first and second features are not in physical contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of a target value (e.g., ±1%, ±2%, ±3%, ±4%, ±5% of the target value).

As planar semiconductor devices, such as metal-oxide-semiconductor field effect transistors ("MOSFETs"), are scaled down through various technology nodes, other approaches to increase device density and speed have been advanced. One approach is the fin field effect transistor ("finFET") device that is a three-dimensional FET that includes the formation of a fin-like channel extending from the substrate. FinFETs are compatible with complementary metal-oxide-semiconductor (CMOS) processes and their three-dimensional structure allows them to be aggressively scaled while maintaining gate control and mitigating short channel effects. Gate stacks are used in planar and three-dimensional FETs for controlling the conductivity of the semiconductor device. A gate stack including a gate dielectric layer and a gate electrode for a finFET device can be formed by a replacement gate process, where a polysilicon sacrificial gate structure is replaced by a metal gate structure. Gate dielectric layers, such as a high-k dielectric layer (e.g., a dielectric layer having dielectric constant greater than about 3.9), is formed between the channel and the gate electrode. Spacers can be disposed on sidewalls of the gate stack to protect the gate structures during fabrication processes, such as ion implantation, gate replacement process, epitaxial source/drain (S/D) structure formation, and other suitable processes. Air gaps can be used in place of spacers to reduce the effective dielectric constant that in turn can reduce parasitic capacitance and improve device performance. Air gaps can be formed by depositing a seal material over an opening between terminals of a semiconductor device such that a pocket of air is trapped between the terminals. A seal material or a seal layer can be a structure that serves as a cap to enclose an opening. As the dielectric constant of air can be lower than a dielectric material, the effective dielectric constant can be reduced. Prior to the seal material deposition, spacers that formed on terminals of the semiconductor device can be etched back to form a curved top surface such that seal material can be uniformly deposited. The spacer etch back process can also cause damage to exposed structures of the semiconductor device. For example, dielectric plugs are inactive regions between adjacent transistors and can be etched during the spacer etch back process. In some embodiments, the dielectric plugs can be formed in place of the S/D regions in inactive regions on the substrate. The dielectric plugs can be formed using a silicon oxide material and a dishing effect can occur in the dielectric plugs after the spacer etch back process. Dielectric plugs having the dishing effect can cause defects in the semiconductor device and lead to low device yield and device failure.

To address the above challenges, the present disclosure provides a semiconductor device and method of fabricating the same to provide simple and cost-effective structures and process for protecting dielectric plugs in semiconductor devices with air gap spacers. A hard mask layer formed using silicon oxide carbide can be formed on the dielectric plugs to protect the underlying dielectric plugs during various fabrication steps, such as a spacer etch back process. The hard mask layer can have a material that has high etch selectivity against the spacer material. For example, the hard mask layer can be formed of silicon oxycarbide. In some embodiments, increasing the carbon atomic percentage can increase the etching selectivity of silicon oxycarbide against spacers formed using silicon nitride.

Figure 5:
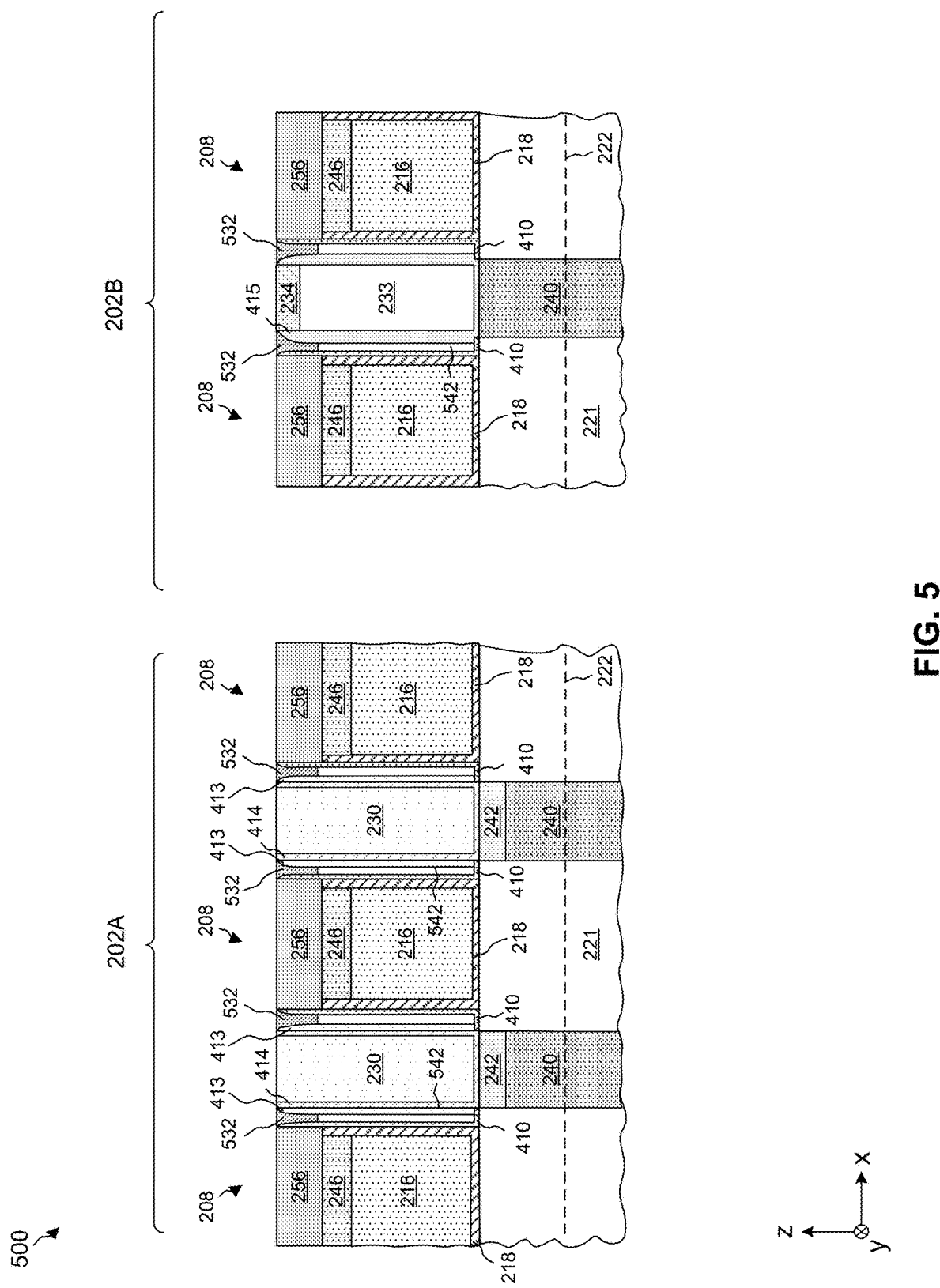
Figure 6:
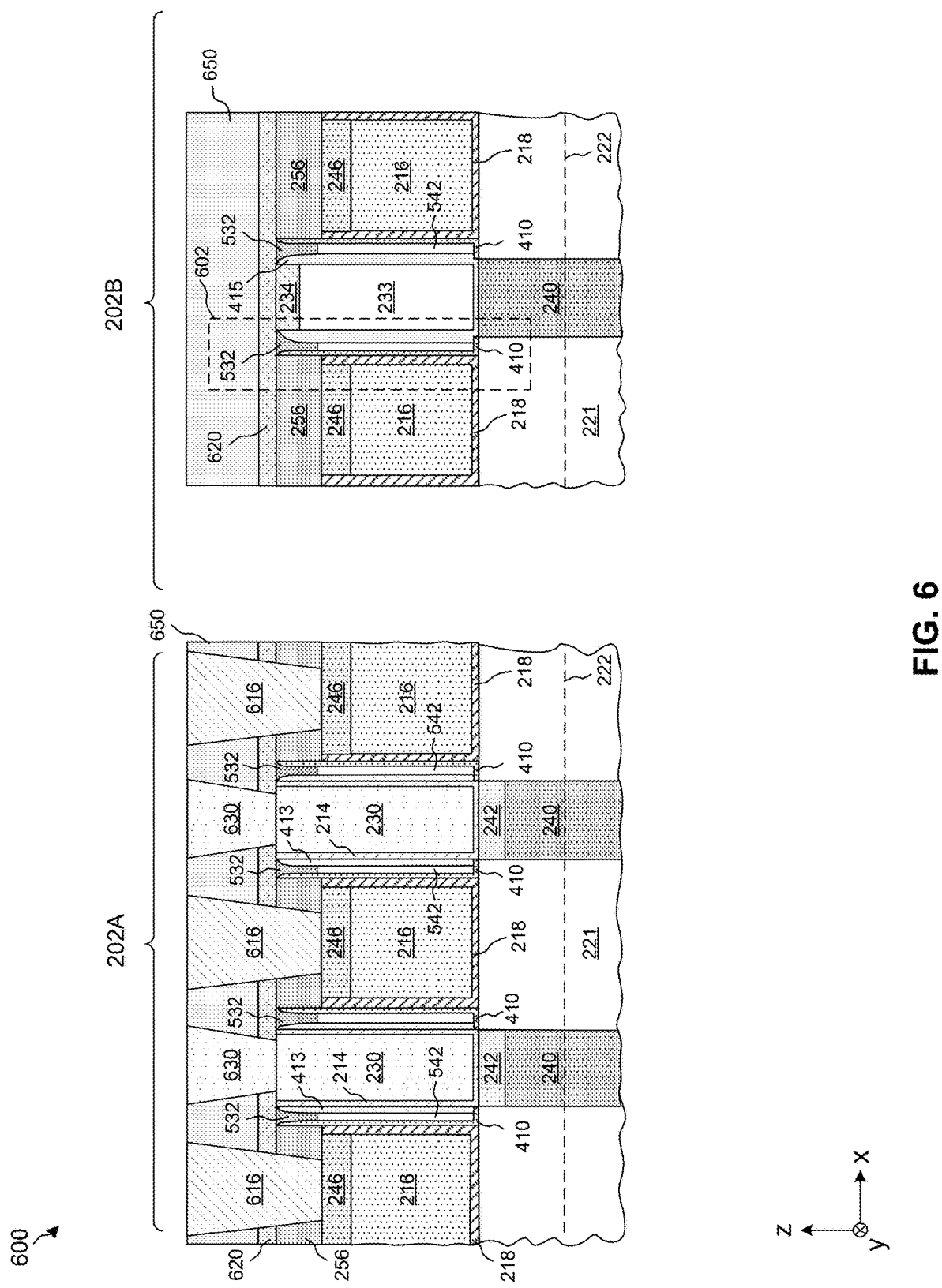
Figure 7:
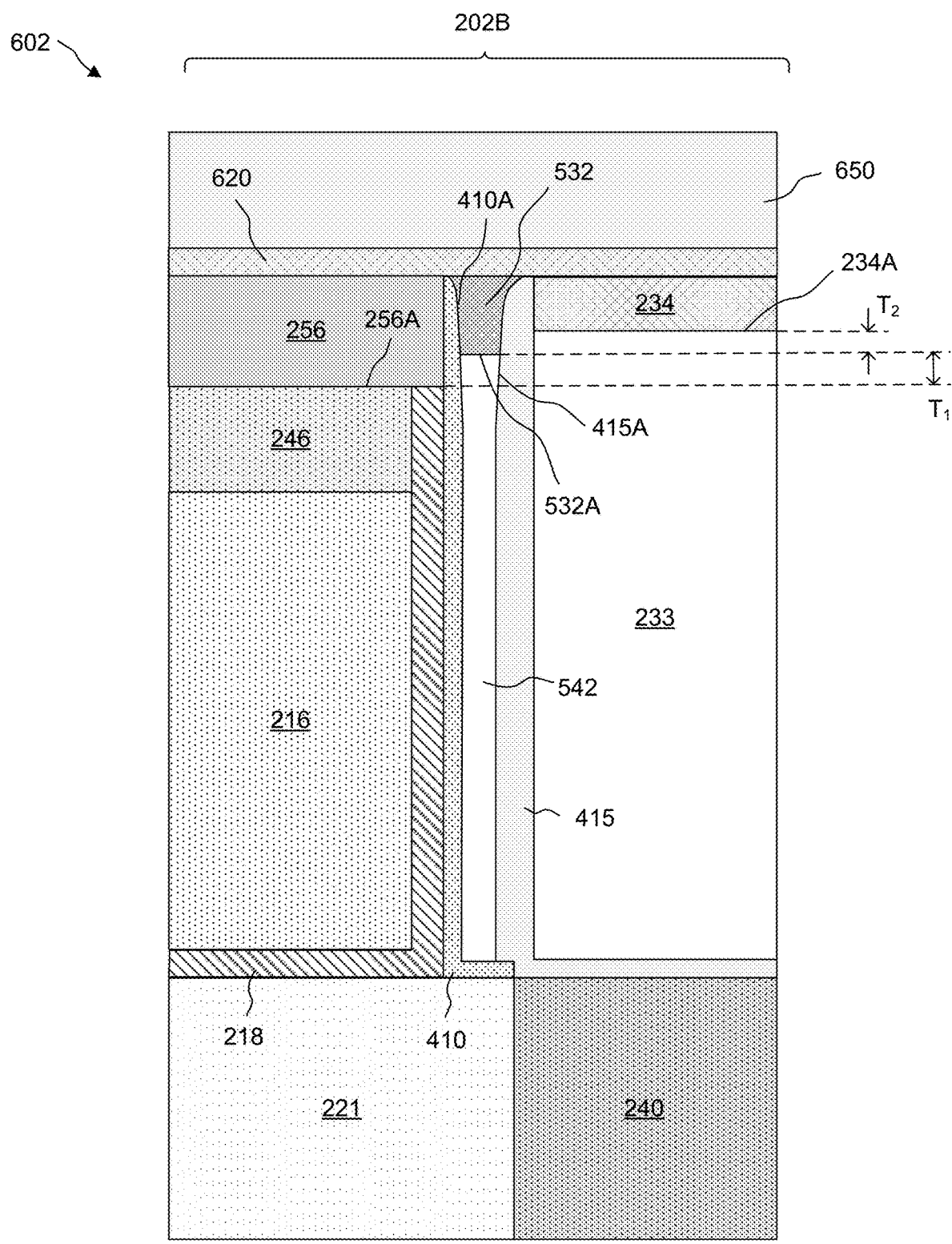

FIG. 1 is an isometric view of exemplary fin field effect transistors (finFETs) structures. FIGS. 2-6 provide various exemplary semiconductor structures and fabrication processes that illustrate the formation of hard masks on dielectric plugs in semiconductor devices, in accordance with some embodiments. FIG. 7 is a flow diagram of a method for forming hard masks on dielectric plugs in semiconductor devices. In some embodiments, the spacers are formed of silicon nitride material and the hard mask layer on the dielectric plugs is formed using material that contains silicon, carbon, and oxygen. For example, the hard mask layer can be formed using silicon oxycarbide (SiCO). The fabrication processes provided herein are exemplary, and alternative processes in accordance with this disclosure can be performed (though they are not shown in these figures).

FIG. 1 is an isometric view of a finFET, according to some embodiments. FinFET 100 can be included in a microprocessor, memory cell, or other integrated circuit. The view of finFET 100 in FIG. 1 is shown for illustration purposes and may not be drawn to scale. FinFET 100 may include other structures, such as additional spacers, liner layers, contact structures, and any other suitable structures, are not illustrated in FIG. 1 for the sake of clarity.

FinFET 100 can be formed on a substrate 102 and can include a fin structure 104 having fin regions 121 and S/D regions 106, gate structures 108 disposed on fin structures 104, spacers 110 disposed on opposite sides of each of gate structures 108, and shallow trench isolation (STI) regions 112. FIG. 1 shows five gate structures 108. However, based on the disclosure herein, finFET 100 can have more or fewer gate structures. In addition, finFET 100 can be incorporated into an integrated circuit through the use of other structural components-such as S/D contact structures, gate contact structures, conductive vias, conductive lines, dielectric layers, and passivation layers—that are omitted for the sake of clarity.

Substrate 102 can be a semiconductor material, such as silicon. In some embodiments, substrate 102 includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

Fin structure 104 represents current-carrying structures of finFET 100 and can traverse along a Y-axis and through gate structures 108. Fin structure 104 can include: (i) portions of fin regions 121 underlying gate structures 108; and (ii) S/D regions 106 disposed on portions of fin regions 121 that are formed on opposing sides of each of gate structures 108. Portions of fin regions 121 of fin structure 104 under gate structures 108 (not shown in FIG. 1) can extend above STI regions 112 and can be wrapped around by respective gate structures 108. Fin regions 121 on opposing sides of gate structures 108 can be etched back such that S/D regions 106 can be epitaxially grown on the etched back portions of fin regions 121.

Fin regions 121 of fin structure 104 can include material similar to substrate 102. S/D regions 106 can include an epitaxially grown semiconductor material. In some embodiments, the epitaxially grown semiconductor material is the same material as substrate 102. In some embodiments, the epitaxially grown semiconductor material includes a different material from substrate 102. The epitaxially grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide. Other materials for fin structure 104 are within the scope of this disclosure.

In some embodiments, S/D regions 106 can be grown by (i) chemical vapor deposition (CVD), such as by low pressure CVD (LPCVD), ultrahigh vacuum CVD (UHVCVD), reduced pressure CVD (RPCVD), and a suitable CVD process; (ii) molecular beam epitaxy (MBE) processes; (iii) a suitable epitaxial process; and (iv) combinations thereof. In some embodiments, S/D regions 106 can be grown by an epitaxial deposition/partial etch process, which repeats the epitaxial deposition/partial etch process at least once. Such repeated deposition/partial etch process is also called a "cyclic deposition-etch (CDE) process." In some embodiments, S/D regions 106 can be grown by selective epitaxial growth (SEG), where an etching gas is added to promote the selective growth of semiconductor material on the exposed surfaces of fin structures, but not on insulating material (e.g., dielectric material of STI regions 112). Other methods for epitaxially growing S/D regions 106 are within the scope of this disclosure.

S/D regions 106 can be p-type regions or n-type regions. In some embodiments, p-type S/D regions 106 can include SiGe and can be in-situ doped during epitaxial growth using p-type dopants, such as boron, indium, and gallium. For p-type in-situ doping, p-type doping precursors, such as diborane ($B_2H_6$), boron trifluoride ($BF_3$), and other p-type doping precursors, can be used. In some embodiments, n-type S/D regions 106 can include Si and can be in-situ doped during an epitaxial growth process using n-type dopants, such as phosphorus and arsenic. For n-type in-situ doping, n-type doping precursors, such as phosphine ($PH_3$), arsine ($AsH_3$), and other n-type doping precursors, can be used. In some embodiments, S/D regions 106 are not in-situ doped, and an ion implantation process is performed to dope S/D regions 106.

Spacer 110 can include spacer portions 110a that form on sidewalls of gate structure 108 and are in contact with dielectric layer 118, spacer portions 110b that form on sidewalls of fin structure 104, and spacer portions 110c that form as protective layers on STI regions 106. Each spacer portion can also be a multi-spacer structure including more than one spacer structure. For example, spacer portion 110a can include more than one spacer and an air gap formed between gate structure 108 and fin structure 104. A seal material can be formed over the air gap to enclose and protect the air gap from subsequent fabrication processes. The air gap and seal material are not shown in FIG. 1 for simplicity. Spacers 110 can include insulating material, such as silicon oxide, silicon nitride, a low-k material, and a combination thereof. Spacers 110 can have a low-k material with a dielectric constant less than about 3.9 (e.g., less than about 3.5, about 3, and about 2.8). As air gaps can have dielectric constant about 1, the effective dielectric constant of spacers 110 can be further reduced compared to spacers formed using only low-k material. The low-k material for spacers 110 can be formed using suitable deposition processes, such as atomic layer deposition (ALD). In some embodiments, spacers 110 can be deposited using CVD, LPCVD, UHVCVD, RPCVD, physical vapor deposition (PVD), any other suitable deposition process, and combinations thereof.

Each gate structure 108 can include a gate electrode 116, a dielectric layer 118 adjacent to and in contact with gate electrode 116, and a gate capping layer 120. Gate structures 108 can be formed by a gate replacement process.

In some embodiments, dielectric layer 118 can be formed using a high-k dielectric material (e.g., dielectric material having a dielectric constant greater than about 3.9). Dielectric layer 118 can be formed by CVD, ALD, PVD, e-beam evaporation, or other suitable processes. In some embodiments, dielectric layer 118 can include (i) a layer of silicon oxide, silicon nitride, and/or silicon oxynitride, (ii) a high-k dielectric material, such as hafnium oxide ($HfO_2$), $TiO_2$, HfZrO, $Ta_2O_3$, $HfSiO_4$, $ZrO_2$, and $ZrSiO_2$, (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, dielectric layer 118 can include a single layer or a stack of insulating material layers. Other materials and formation methods for dielectric layer 118 are within the scope of this disclosure. For example, portions of dielectric layer 118 are formed on horizontal surfaces, such as a top surface of STI regions 112. Although not visible in FIG. 1, dielectric layer 118 can also be formed on top and sidewalls of fin regions 121 that are under gate electrode 116. In some embodiments, dielectric layer 118 is also formed between sidewalls of gate electrode 116 and spacer portions 110a, as shown in FIG. 1. In some embodiments, dielectric layer 118 have a thickness 118t in a range from about 1 nm to about 5 nm.

Gate electrode 116 can include a gate work function metal layer 122 and a gate metal fill layer 124. In some embodiments, gate work function metal layer 122 is disposed on dielectric layer 118. Gate work function metal layer 122 can include a single metal layer or a stack of metal layers. The stack of metal layers can include metals having work functions similar to or different from each other. In some embodiments, gate work function metal layer 122 can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum nitride (TaSiN), tantalum carbon nitride (TaCN), titanium aluminum (TiAl), titanium aluminum nitride (TiAlN), tungsten nitride (WN), metal alloys, and combinations thereof. Gate work function metal layer 122 can be formed using a suitable process, such as ALD, CVD, PVD, plating, or combinations thereof. In some embodiments, gate work function metal layer 122 has a thickness 122t in a range from about 2 nm to about 15 nm. Other materials, formation methods, and thicknesses for gate work function metal layer 122 are within the scope of this disclosure.

Gate metal fill layer 124 can include a single metal layer or a stack of metal layers. The stack of metal layers can include metals different from each other. In some embodiments, gate metal fill layer 124 can include a suitable conductive material, such as Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and combinations thereof. Gate metal fill layer 124 can be formed by ALD, PVD, CVD, or other suitable deposition processes. Other materials and formation methods for gate metal fill layer 124 are within the scope of this disclosure.

In some embodiments, gate capping layer 120 can have a thickness 120t in a range from about 5 nm to about 50 nm and can protect gate structure 108 during subsequent processing of finFET 100. Gate capping layer 120 can include a nitride material, such as silicon nitride, silicon-rich nitride, and silicon oxynitride. Other materials for gate capping layer 120 are within the scope of this disclosure.

STI regions 112 can provide electrical isolation to finFET 100 from neighboring active and passive elements (not illustrated herein) integrated with or deposited onto substrate 102. STI regions 112 can have a dielectric material, such as silicon oxide, silicon nitride, silicon oxynitride, fluorine-doped silicate glass (FSG), a low-k dielectric material, and other suitable insulating materials. In some embodiments, STI regions 112 can include a multi-layered structure. The cross-sectional shapes of fin structure 104, S/D regions 106, gate structures 108, spacers 110, and STI regions 112 are illustrative and are not intended to be limiting.

Figure 8:
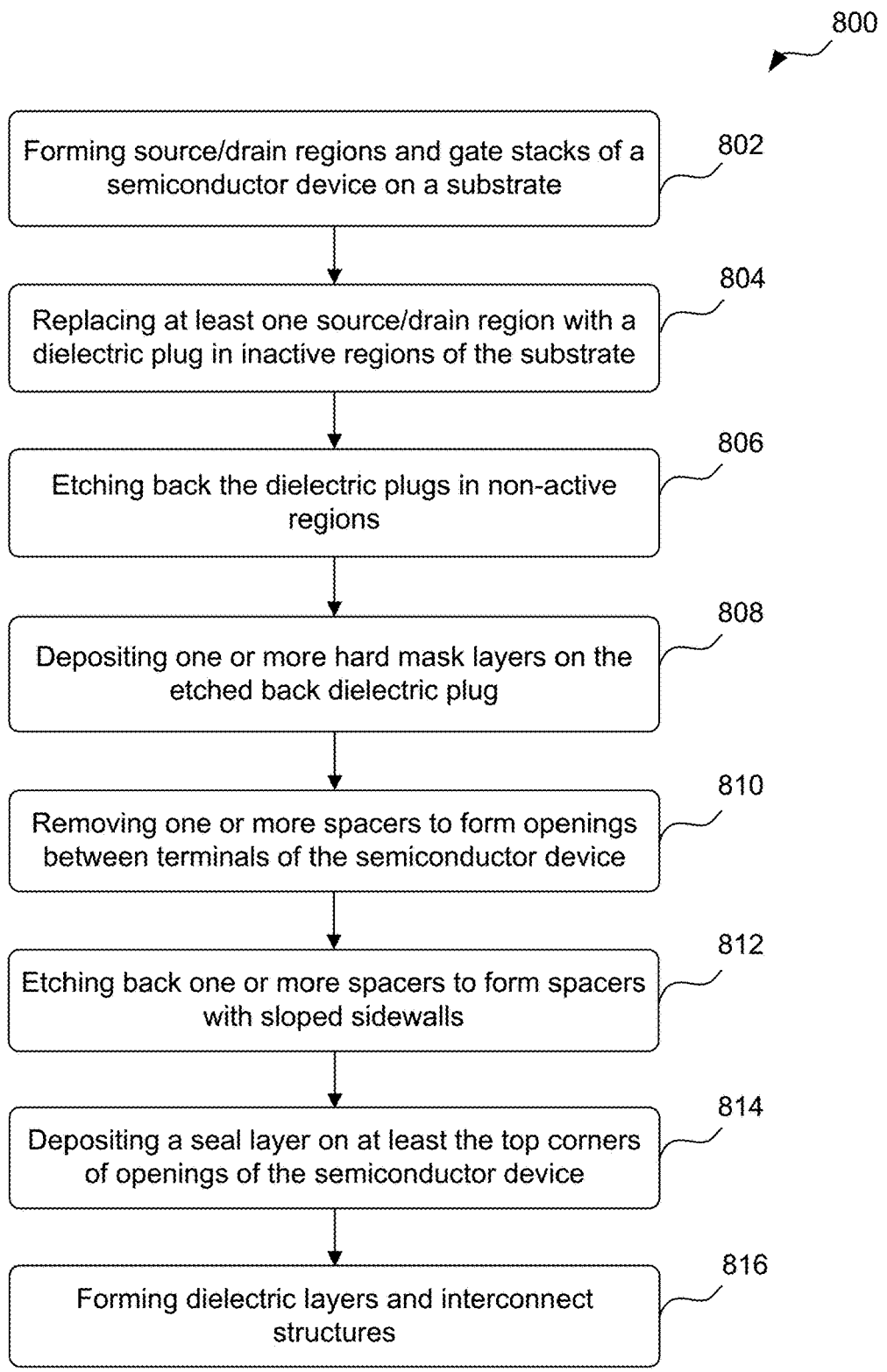
FIG. 8 is a flow diagram of a method for forming hard masks layers in semiconductor structures, in accordance with some embodiments.

FIGS. 2A-2D and 3-7 provide various exemplary semiconductor structures and fabrication processes that illustrate the formation of hard mask layers on dielectric plugs of semiconductor devices. FIG. 8 is a flow diagram of a method 800 of forming hard mask layers on dielectric plugs of semiconductor devices, in accordance with some embodiments of the present disclosure. Based on the disclosure herein, other operations in method 800 can be performed. Further, the operations of method 800 can be performed in a different order and/or vary.

The hard mask layers formed on dielectric plugs can provide the benefit of protecting the underlying material during various fabrication processes, such as a spacer etch back process. The fabrication processes can be used to form planar semiconductor devices or vertical semiconductor devices, such as finFETs. In some embodiments, the fabrication processes illustrated in FIGS. 2-7 can be used to form semiconductor structures similar to finFET structures described above in FIG. 1. For example, the semiconductor structures illustrated in FIGS. 2-7 can be similar to finFET 100 during different stages of fabrication as viewed from the cut A-A' illustrated in FIG. 1.

Figure 2A:
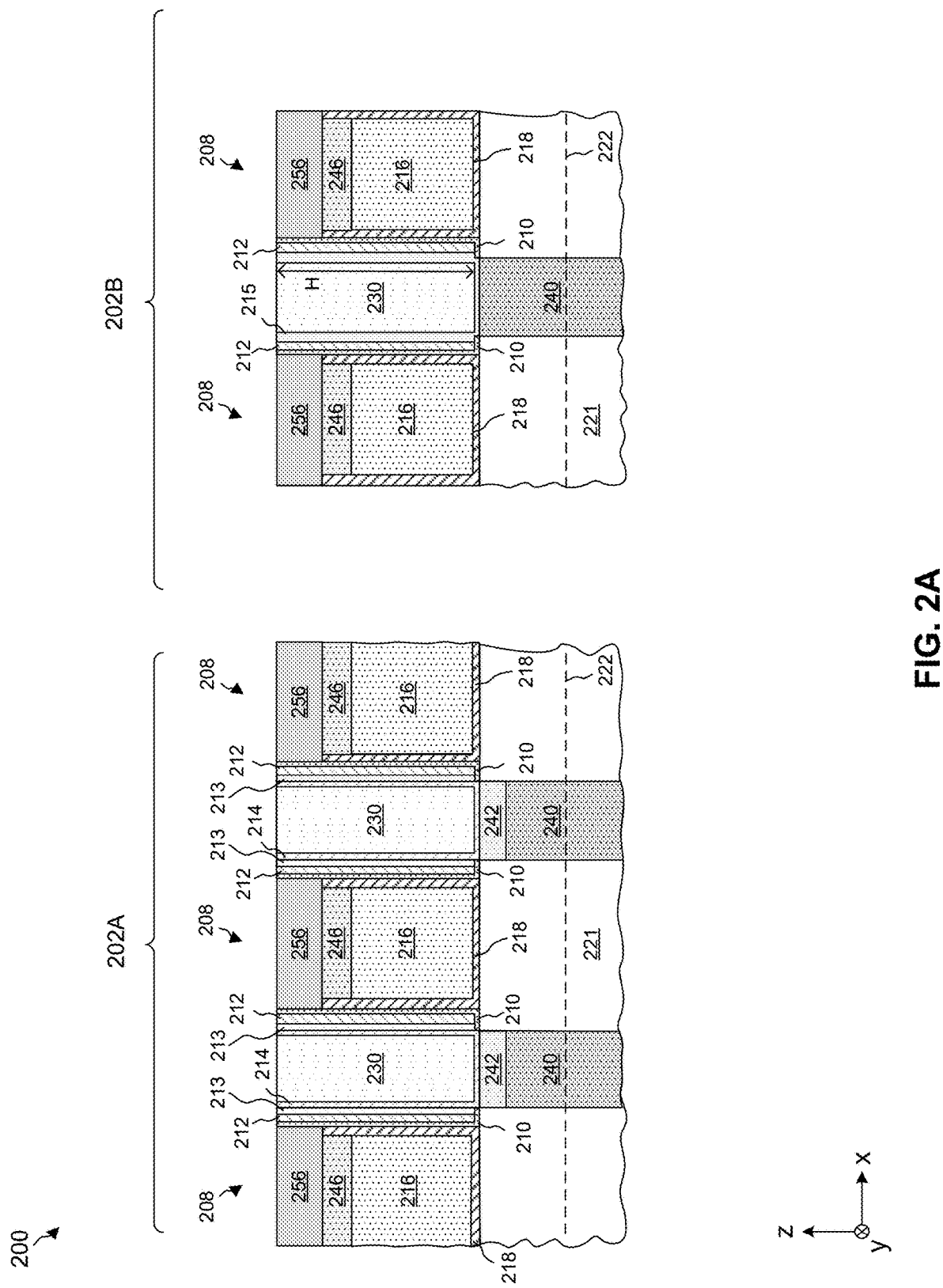
FIGS. 2A-2D are cross-sectional views of forming silicon carbide oxide hard masks in semiconductor structures, in accordance with some embodiments.

Referring to operation 802 of FIG. 8, source/drain regions and gate stacks are formed on a substrate, according to some embodiments. FIG. 2A is a cross-sectional view of a semiconductor structure 200 that includes an active region 202A and an inactive region 202B. Active region 202A can include one or more active semiconductor devices that form a part of an electrical circuitry. Inactive region 202B can be an inactive region that includes one or more partially formed inactive semiconductor devices that are designed to be sacrificed at a later fabrication stage (e.g., removed during a dicing process.) Inactive region 202B can be used to provide fabrication uniformity and reduce a loading effect during the fabrication and before the dicing process during which a semiconductor wafer is cut into individual dies. For example, gate structures, S/D regions, spacers can be formed in inactive region 202B to reduce the loading effect across the semiconductor wafer. For illustration purposes, three neighboring gate structures 208 are formed in each of active region 202A and inactive region 202B. More gate structures can be formed in active region 202A and inactive region 202B. The substrate can include fin region 221. Each gate stack such as gate structure 208 includes a gate dielectric layer 218 and a gate electrode 216. Gate dielectric layer 218 can be formed on sidewalls and bottom surfaces of gate electrode 216. Channel regions for semiconductor devices, such as finFETs, can be formed in fin region 221 and under gate structures 208.

Fin region 221 can be current-carrying semiconductor structures formed on the substrate. For example, fin region 221 can be similar to fin region 121 described above in FIG. 1. In some embodiments, fin region 221 can include a semiconductor material, such as germanium, silicon, silicon carbide, gallium arsenide, gallium phosphide, indium phosphide, indium arsenide, indium antimonite, silicon germanium carbide, silicon germanium, gallium arsenic phosphide, gallium indium phosphide, gallium indium arsenide, gallium indium arsenic phosphide, aluminum indium arsenide, aluminum gallium arsenide, any suitable material, and combinations thereof. In some embodiments, fin region 221 can be doped with p-type or n-type dopants.

Gate dielectric layer 218 can be formed on fin region 221 and formed using a high-k dielectric material. Gate dielectric layer 218 can deposited by CVD, ALD, PVD, e-beam evaporation, or other suitable processes. In some embodiments, gate dielectric layer 218 can include a high-k dielectric material, such as $HfO_2$. In some embodiments, gate dielectric layer 218 can include $TiO_2$, $HfZrO$, $Ta_2O_3$, $HfSiO_4$, $ZrO_2$, and $ZrSiO_2$. In some embodiments, gate dielectric layer 218 can be similar to dielectric layer 118 described above in FIG. 1.

Gate electrode 216 can be formed on gate dielectric layer 218 and can include a single metal layer or a stack of metal layers. Gate structures 208 can further include work function layers and are not illustrated in FIG. 2 for simplicity. The stack of metal layers can include metals having work functions similar to or different from each other. In some embodiments, gate electrode 216 can be formed of a conductive material, such as Al, Cu, W, Ti, Ta, TiN, TaN, NiSi, CoSi, Ag, TaC, TaSiN, TaCN, TiAl, TiAlN, WN, metal alloys, and combinations thereof. Gate electrode 216 can be formed using a suitable deposition process, such as ALD, CVD, PVD, plating, and combinations thereof. Other materials and formation methods for gate electrode 216 are within the scope of this disclosure. In some embodiments, gate electrode 216 can be formed using a gate replacement process, where a polysilicon gate is removed and a metal gate electrode is formed in the place of the removed polysilicon gate.

Contact plugs 246 can be formed on gate electrode 216. In some embodiments, contact plugs 246 can be formed of conductive material and formed between opposing sidewalls of gate dielectric layer 218. In some embodiments, contact plugs 246 can be formed using tungsten. In some embodiments, contact plugs can be formed using tantalum, titanium, titanium nitride, tungsten nitride, tantalum nitride, any suitable conductive material, and/or combinations thereof. In some embodiments, contact plugs 246 can be formed on gate electrode 216 in both active regions 202A and inactive regions 202B.

Self-aligned contacts (SACs) 256 can be formed above gate electrode 216 and contact plugs 246. In some embodiments, SACs 256 can be formed using a dielectric material, such as silicon nitride, silicon oxide, silicon oxynitride, silicon carbide, silicon carbo-nitride, boron nitride, silicon boron nitride, silicon carbon boron nitride, any suitable dielectric material, and/or combination thereof.

Spacer structures can be formed on sidewalls of gate structures 208. In some embodiments, gate structures can include a gate electrode, dielectric layers, spacers, any other suitable structures, and are collectively referred to as gate structures for ease of reference. In active regions 202A, spacers 210, 212, and 213 can be formed on sidewalls of gate dielectric layer 218 and on top surfaces of fin region 221. Spacer structures are formed on sidewalls of gate electrode 216 to protect gate dielectric layer 218 and gate electrode 216 during subsequent processing. In some embodiments, spacer 210 can have an L-shaped cross section with a vertical portion formed on the sidewall of gate dielectric layer 218 and a horizontal portion formed on the top surface of fin region 221. In some embodiments, spacer 210 is only formed on the sidewall of gate dielectric layer 218. In some embodiments, spacer 210 can be formed using silicon oxycarbonitride. In some embodiments, spacer 210 can be formed using silicon nitride. In some embodiments, spacer 210 can be formed using a suitable dielectric material, such as silicon carbide nitride, silicon oxide, any suitable dielectric material, and combinations thereof. In some embodiments, the carbon atomic content can be less than about 30% for spacer 210 formed using silicon carbide nitride. In some embodiments, the carbon atomic content of spacer 210 can be between about 20% and about 30%. Additional spacers, such as spacers 212 and 213, can also be formed. For example, spacers 212 and 213 can be formed on the horizontal portion of spacer 210, on the top surface of fin region 221, or both. In some embodiments, spacers 212 can be formed using a dielectric material, such as silicon. In some embodiments, spacer 213 can be formed using a different material from spacers 212, such as silicon nitride. In some embodiments, the material that forms spacers 210 and 213 can have high etch selectivity (e.g., greater than about 10) against spacers 212 such that when spacers 212 are removed spacers 210 and 213 can remain substantially intact. In some embodiments, spacers 210 and 212 can be formed using a low-k dielectric material. Similarly, in inactive region 202B, spacers 210, 212, and 215 are formed. Spacer 215 can be formed in physical contact with spacers 210 and 212. Spacers 215 and 213 can be formed using substantially similar material. For example, spacers 215 can be formed using silicon nitride, silicon oxycarbonitride, silicon carbide, any suitable dielectric material, and/or combinations thereof.

S/D regions 240 can be formed in fin region 221. S/D regions 240 can be p-type regions or n-type regions. In some embodiments, p-type S/D regions 240 can include SiGe and can be in-situ doped during an epitaxial growth process using p-type dopants, such as boron, indium, and gallium. For p-type in-situ doping, p-type doping precursors, such as $B_2H_6$, $BF_3$, and other p-type doping precursors, can be used. In some embodiments, n-type S/D regions 240 can include Si and can be in-situ doped during an epitaxial growth process using n-type dopants, such as phosphorus and arsenic. For n-type in-situ doping, n-type doping precursors, such as $PH_3$, $AsH_3$, and other n-type doping precursors, can be used. In some embodiments, S/D regions 240 are not in-situ doped, and an ion implantation process is performed to dope S/D regions 240. In some embodiments, spacer 215 can be in physical contact with S/D regions 240. In some embodiments, S/D regions 240 can be similar to S/D regions 160 described above in FIG. 1.

Silicide layers 242 can be formed on S/D regions 240 to reduce contact resistance between S/D regions 240 and S/D contacts 230. In some embodiments, silicide layers 242 can be formed in active regions 202A. In some embodiments, silicide layers 242 can include a suitable silicide material, such as tungsten silicide, titanium silicide, tantalum silicide, any suitable silicide material, and/or combinations thereof.

S/D contacts 230 can be in physical and electrical contact with source/drain regions 240. S/D contacts 230 can be formed by depositing a conductive material between adjacent gate structures 208. For example, openings can be formed between spacers 212 to expose underlying S/D regions 240. In some embodiments, S/D contacts 230 can be formed in active region 202A and inactive region 202B. A deposition process can be performed to deposit the conductive material in the openings such that electrical connections can be made. In some embodiments, a contact etch stop layer (CESL) 214 can be deposited in the opening prior to the deposition of the conductive materials. Examples of the conductive material deposition process can include PVD, sputtering, electroplating, electroless plating, any suitable deposition process, and combinations thereof. A planarization process can be performed after the deposition process such that top surfaces of gate electrode 216, spacers 210 and 212, CESL 214, and source/drain contacts 230 can be substantially coplanar (e.g., an even surface). In some embodiments, S/D contacts 230 can be formed using tungsten, aluminum, cobalt, silver, any suitable conductive material, and combinations thereof.

Figure 2B:
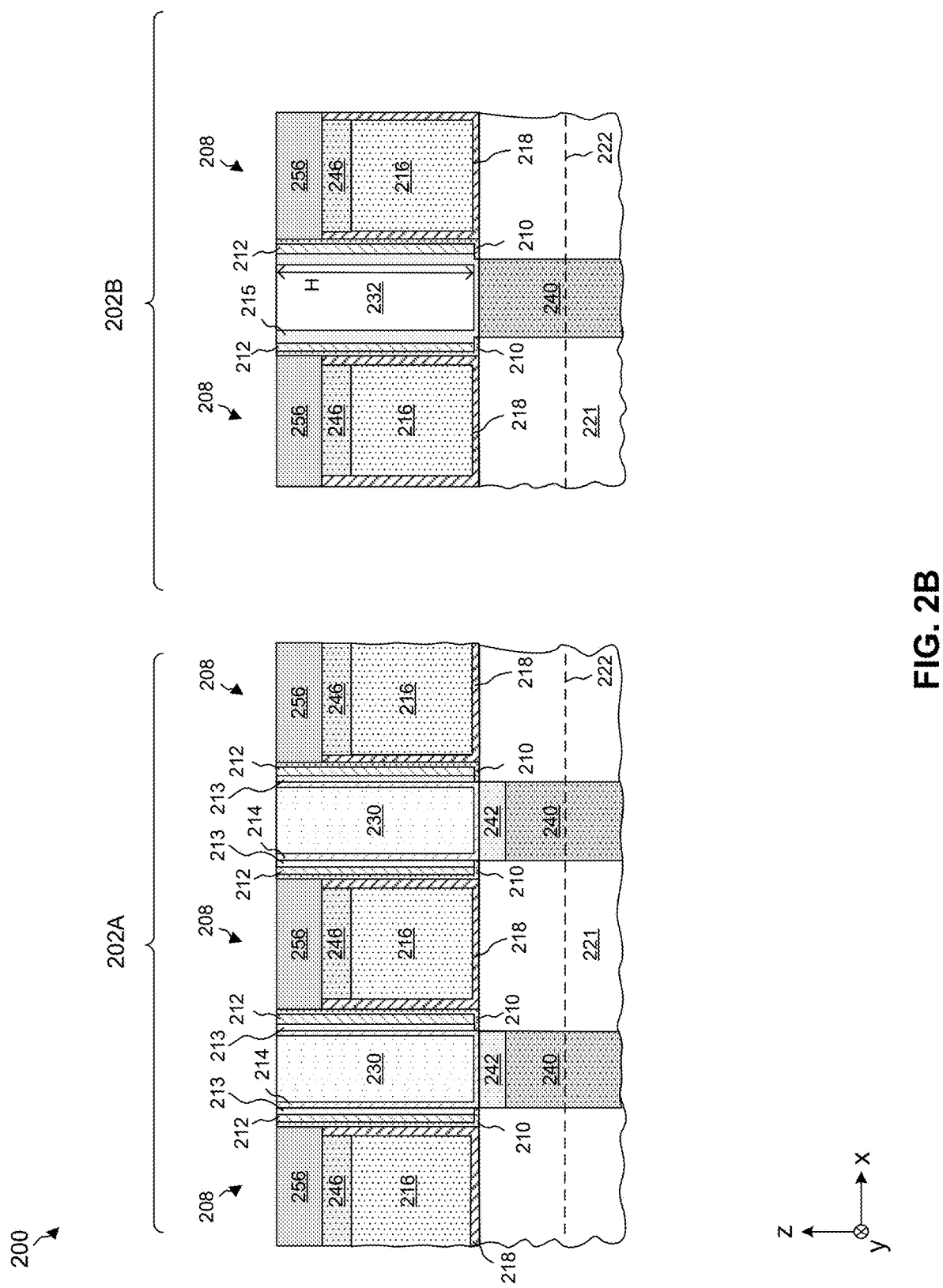

Referring to operation 804 of FIG. 8, dielectric plugs 232 can be formed in inactive regions, according to some embodiments. As shown in FIG. 2B, dielectric plugs 232 are formed in inactive region 202B and between spacers 215. In some embodiments, dielectric plugs 232 can be formed by removing source/drain contacts 230 in inactive regions 202B and depositing a dielectric material between spacers 215. An etching process such as wet etching or dry plasma etching can be performed in inactive regions 202B to remove source/drain contacts 230. A masking layer can be deposited and patterned to protect structures in active region 202A while the etching process removes source/drain contacts 230 in inactive region 202B and exposes the underlying spacers 215. One or more deposition process can be used to deposit a dielectric material on spacers 215 and between gate structures 208 to form dielectric plugs 232. In some embodiments, dielectric plugs 232 can be formed of silicon dioxide. In some embodiments, dielectric plugs 232 can be formed using any suitable material. In some embodiments, dielectric plugs 232 can be used to provide electrical and physical isolation between devices or regions on the semiconductor die. In some embodiments, dielectric plugs 232 can be a sacrificial structure that is removed during a subsequent fabrication process. For example, dielectric plugs 232 can be removed during a dicing process. Dielectric plugs 232 can reduce the loading effect by providing similar pattern density across the semiconductor wafer. For example, gate structures 208 formed in inactive region 202B can have substantially the same pattern density as of those formed in active regions 202A. In some embodiments, a height H of dielectric plugs 232 can be between about 30 nm and about 60 nm. In some embodiments, the height H can be between about 30 nm and about 40 nm, between about 40 nm and about 50 nm, between about 50 nm and about 60 nm, or any suitable heights. In some embodiments, the height H can be greater than about 60 nm. Reducing the height H may lead to a lower aspect ratio of the opening that is formed by removing source/drain contacts 230, which may in turn increase the deposition uniformity of dielectric plugs 232.

Similar to finFET 100 described in FIG. 1, semiconductor structure 200 can be formed on a substrate where fin regions 221 protrude from STI regions. The STI regions are not visible from the cross-sectional view of semiconductor structure 200 illustrated in FIG. 2, but a top surface of the STI regions is represented by dashed line 222 for ease of description.

Figure 2C:
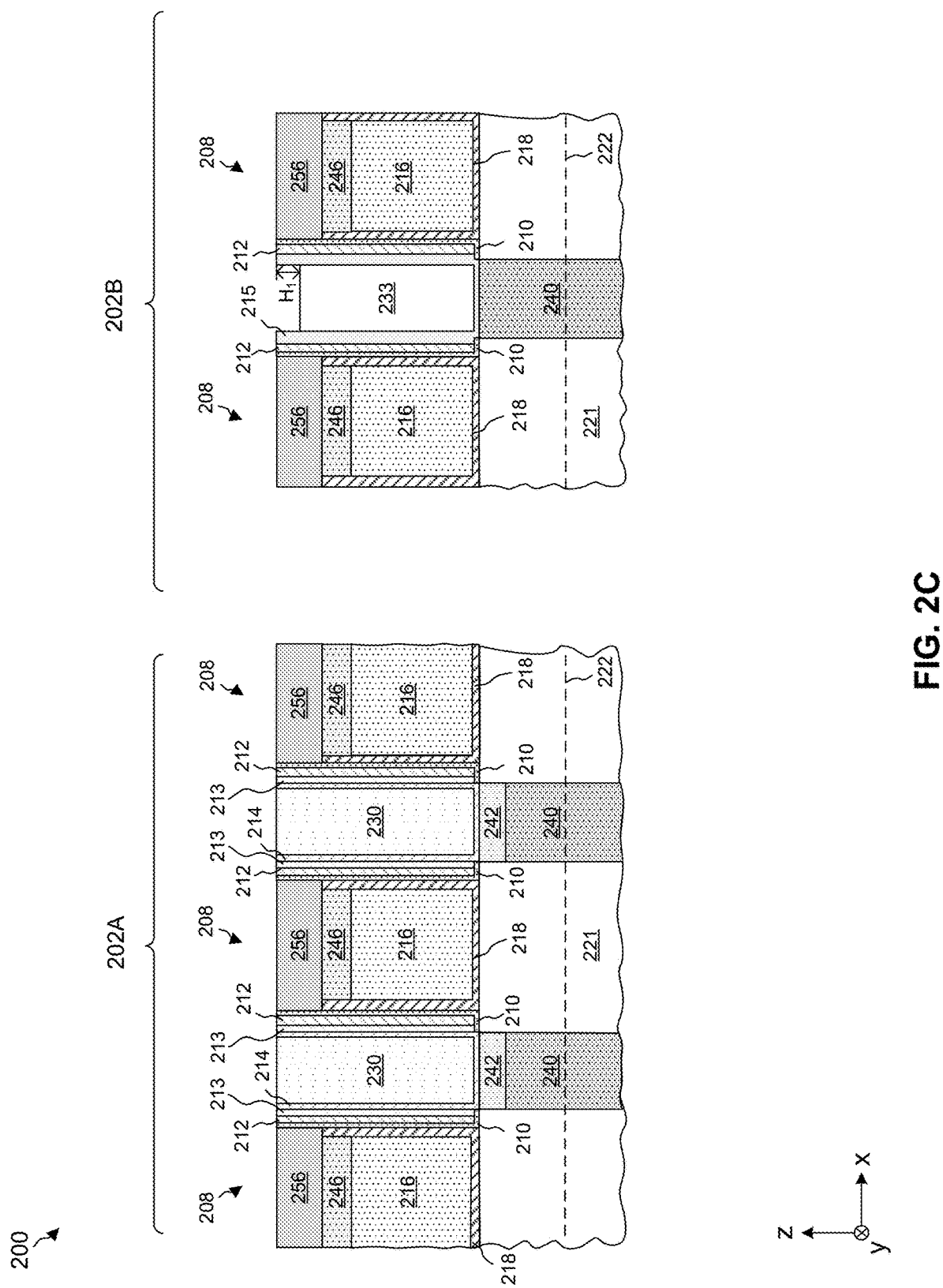

Referring to operation 806 of FIG. 8, dielectric plugs are etched back to form etched-back dielectric plugs, according to some embodiments. FIG. 2C is a cross-sectional view of the semiconductor device after the dielectric plugs are etched back in inactive regions 202B. In some embodiments, dielectric plugs are etched back by a height of Hi, as illustrated in FIG. 2C. In some embodiments, a height ratio of height Hi over height H of the height of dielectric plug 232 can be between about 0.1 and about 0.5. For example, the ratio can be between about 0.1 and about 0.25, between about 0.25 and about 0.35, between about 0.35 and about 0.5, or any suitable ratio. In some embodiments, height Hi can be between about 10 nm and about 15 nm. Increasing the ratio or height Hi can result in a greater thickness of a hard mask layer (not shown in FIG. 2C but shown in FIG. 2D as hard mask 234) that is formed on etched-back dielectric plug 233. Therefore, increasing the ratio or height Hi can provide, among other things, more durable and prolonged protection for underlying etched-back dielectric plugs 233 by the hard mask layer against subsequent etching process. In some embodiments, one or more etching processes can be used to etch back dielectric plugs 232 to form etched-back dielectric plugs 233. In some embodiments, the one or more etching processes can include a plasma dry etching process. For example, the one or more etching process can be a plasma dry etching process using precursors, such as carbon tetrafluoride, oxygen, sulfur hexafluoride, any suitable precursors, and combinations thereof. In some embodiments, the one or more etching processes can include a wet etching process, such as a buffered oxide etch (BOE) process. A blocking layer (not shown in FIG. 2C) can cover other structures of semiconductor device 200 such that dielectric plugs 232 are exposed to the one or more etching processes. After dielectric plugs 232 are etched to form etched-back dielectric plugs 233, the blocking layer can be removed.

Figure 2D:
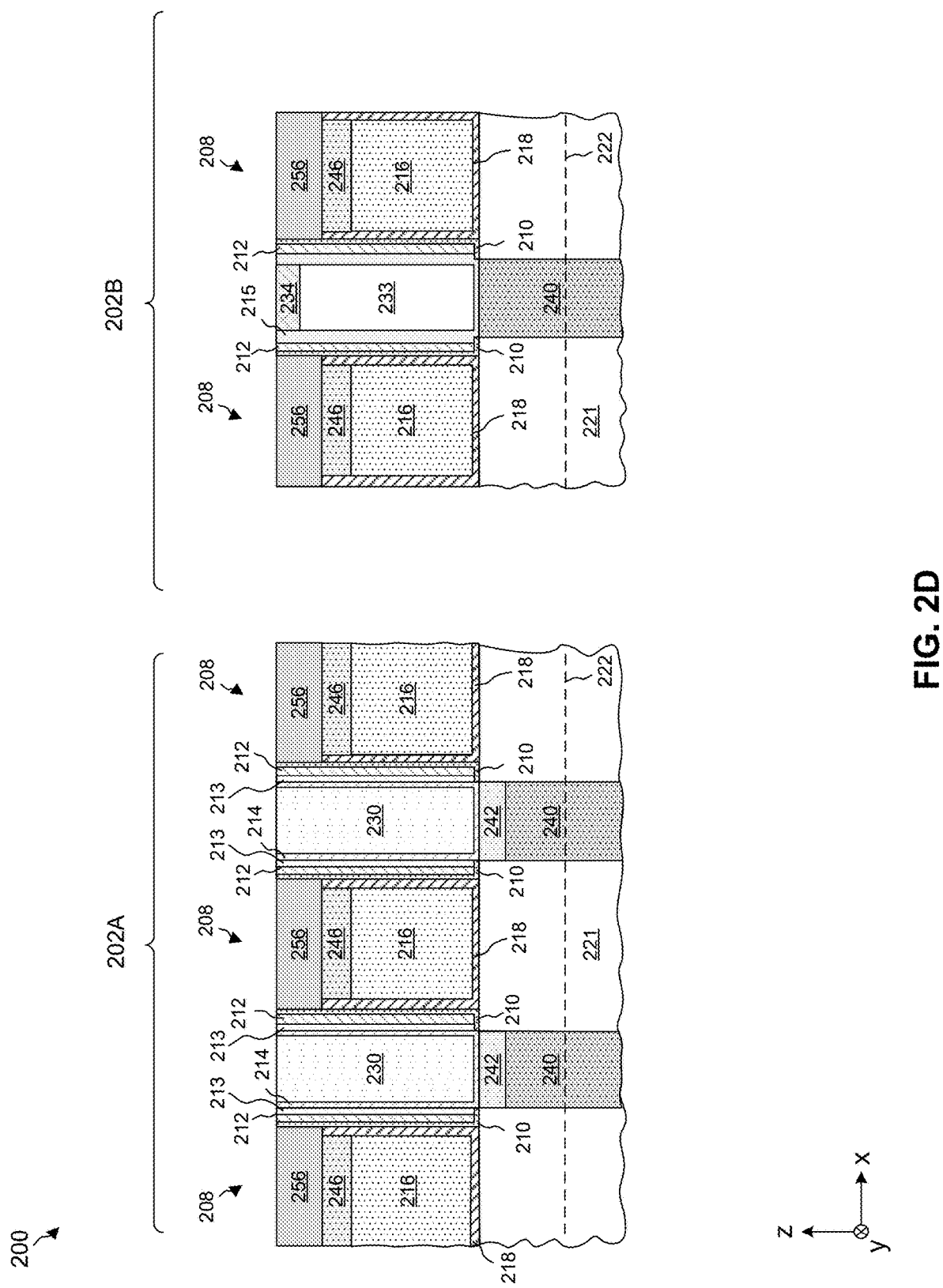

Referring to operation 808 of FIG. 8, a hard mask layer can be deposited on the etched-back dielectric plugs, according to some embodiments. FIG. 2D is a cross-sectional view of semiconductor device 200 after hard mask 234 has been formed on etched-back dielectric plugs 233. In some embodiments, hard mask 234 can be formed of silicon oxycarbide. Hard mask 234 is used to protect the underlying etched-back dielectric plugs 233 during a subsequent spacer etch back process during which spacers 212 are removed and spacers 210, 213, and 215 are etched back. Hard mask 234 can be formed using a material that has high etch selectivity (e.g., greater than about 10) against the materials that form spacers 210, 213, and/or 215. Therefore, hard mask 234 can remain substantially intact during the spacer etch back process. In some embodiments, spacers 210, 213, and 215 can be formed using silicon nitride, silicon oxycarbonitride, or any other suitable dielectric material. In some embodiments, etched-back dielectric plugs 233 can be formed using silicon oxide. Hard mask 234 can be formed using any suitable deposition method, such as CVD, ALD, LPCVD, UHVCVD, RPCVD, PVD, any other suitable deposition process, and combinations thereof. In some embodiments, post deposition treatment processes, such as an annealing process, can be performed on hard mask 234. For example, hard mask 234 can be heated to a temperature between about 100° C. and about 300° C. to remove impurities and increase film quality. Without hard mask 234, the spacer etch back process of spacers 210, 213, and/or 215 can cause damage to dielectric plugs 232. Hard mask 234 can protect underlying etched-back dielectric plugs due to its high etch selectivity against silicon nitride material. In some embodiments, the carbon atomic percentage of hard mask 234 can be adjusted to provide tunable etch selectivity. For example, increasing the carbon atomic percentage in silicon oxycarbide of hard mask 234 can increase its etch selectivity against silicon nitride material. In some embodiments, the spacer etch back process is performed at room temperature and the carbon atomic percentage of hard mask 234 can be between about 6% and about 20%. For example, the carbon atomic percentage can be between about 6% and about 10%, between about 10% and about 15%, between about 15% and about 20%. In some embodiments, the deposition process of hard mask 234 can be performed at an elevated temperature (e.g., about 110° C.) and the carbon atomic percentage of hard mask 234 can be greater than about 20%. Increasing the carbon atomic percentage of hard mask 234 can be achieved in various ways. For example, the carbon atomic percentage increase can be achieved by (i) increasing the carbon content in the precursor used in the deposition process; (ii) increasing the deposition temperature (e.g., depositing at a temperature between about 150° C. and about 200° C.); (iii) increasing the annealing temperature; or (iv) performing any suitable post deposition treatment processes.

Figure 3:
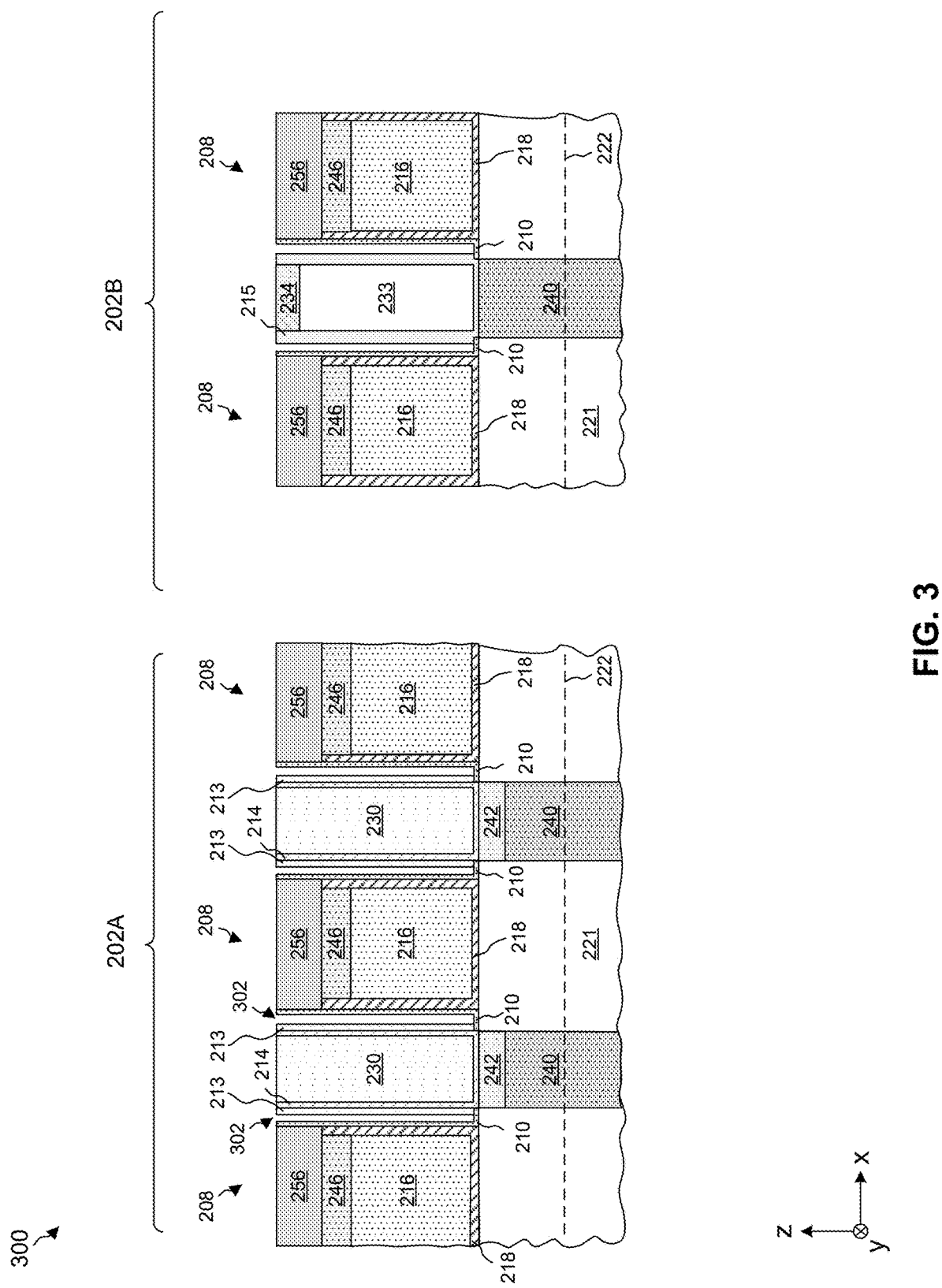
FIGS. 3-7 are cross-sectional views of partially formed semiconductor devices, in accordance with some embodiments.

Referring to operation 810 of FIG. 8, one or more spacers are removed to form openings between terminals of the semiconductor device, according to some embodiments. FIG. 3 is a cross-sectional view of the semiconductor device after one or more spacers are removed to form openings. Examples of terminals of a semiconductor device can be a gate structure, a S/D structure, or any other suitable structure. Gate structure 208 shown in FIG. 3 can include gate dielectric layer 218 and gate electrode 216. In some embodiments, gate structure 208 can also include spacer 210. S/D structures can include S/D contacts 230 and CESL 214. In some embodiments, S/D structures can further include S/D regions 240 formed in fin region 221. In some embodiments, S/D structures can include etched-back dielectric plugs 233 and hard mask 234 for ease of reference. In active regions 202A, one or more spacers of the spacers between gate electrode 216 and S/D contacts 230 can be removed. For example, spacers 212 can be removed to form openings 302 that are surrounded by spacers 210 and 213. In inactive regions 202B, spacers 212 can be removed to form openings 304 that are surrounded by spacers 210 and 215. One or more etching processes can be used to remove spacers 212. In some embodiments, an etching process that has high etch selectivity of spacers 212 over other structures in semiconductor structure 200 can be used to remove spacers 212 while keeping the other exposed structures intact. For example, spacers 212 can be formed using silicon, and a wet etching process and/or a plasma etching can be used to selectively remove spacers 212. In some embodiments, spacers 212 can be formed of silicon oxide and hard mask 234 can be formed of silicon oxycarbide. In such configuration, the etching process can be configured to remove silicon oxide material at a greater rate (e.g., greater than about 10 times) over silicon oxycarbide material. In some embodiments, spacers 212 can be formed using silicon carbide nitride. In some embodiments, a patterning process can be used to cover all exposed structures except spacers 212 such that one or more etching processes can be used to remove spacers 212.

Figure 4:
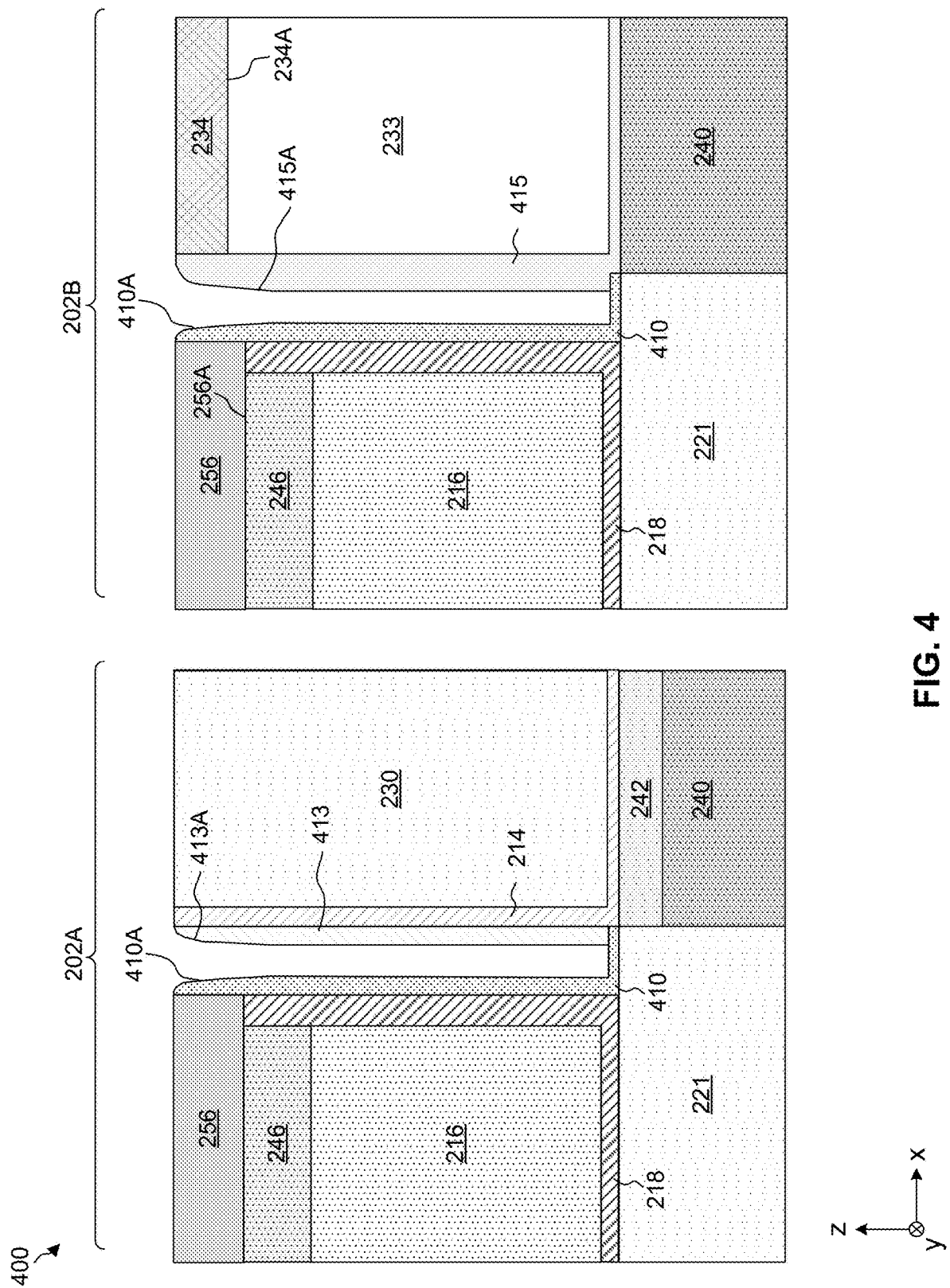

Referring to operation 812 of FIG. 8, one or more spacers are etched back to form spacers with sloped sidewalls, according to some embodiments. FIG. 4 is a cross-sectional view of enlarged portions of semiconductor device 300 in FIG. 3 after one or more spacers are etched back. In active regions 202A, spacers 210 and 213 are etched back to form etched-back spacers 410 and 413, respectively. Etched-back spacers 410 and 413 can have sloped sidewalls 410A and 413A. Similarly, in inactive regions 202B, etched-back spacers 410 and 415 can have sloped sidewalls 410A and 415A, respectively. The sloped sidewalls can facilitate subsequently formed seal material such that the probability of forming voids in the seal material can be lowered. One or more etching process can be used to etch back the one or more spacers. One or more plasma etching processes configured with suitable processing parameters can be used to form the sloped profile of the sidewalls. For example, the etch process parameters can include time variable process parameters, such as gas flow ratio of etchant gas to passivation gas, plasma source power, substrate bias voltage, bottom plate temperature, any suitable process parameters, and/or combinations thereof. The etchant gas is selected to etch spacers 210, 213, and 215 with high selectivity over hard mask 234. For example, the etchant gas can include carbon tetrafluoride, sulfur hexafluoride, hydrogen bromide, chlorine, any suitable etchant gas, and/or combinations thereof. The passivation gas can include nitrogen, oxygen, argon, any suitable passivation gas, and/or combinations thereof. Spacers 210, 213, and 215 can be formed of nitrogen-containing dielectric material. For example, spacers 210, 213, and 215 can be formed using silicon nitride, silicon carbon nitride, silicon oxynitride, combinations thereof, or any suitable nitrogen-containing dielectric material. In some embodiments, spacers 210, 213, and 215 can be formed with other suitable dielectric material, such as silicon oxide, fluorine-doped silicon oxide, fluorinated silica glass, combinations thereof, or any suitable dielectric material. Without hard mask 234 formed in inactive region 202B, etched-back dielectric plug 233 can be damaged during the spacer etch back process, as the one or more etching process can also react with materials that form dielectric plug. For example, dielectric plugs formed using silicon oxide can also be etched during the one or more etching processes that etches spacers formed using silicon nitride. In some embodiments, dielectric plugs without hard mask 234 may be etched at a faster etching rate than those of spacers 210, 213, and 215. Hard mask 234 formed using silicon oxycarbide can prevent dielectric plug 233 from being etched during the spacer etch back process. In some embodiments, increasing the carbon atomic percentage can increase the etching selectivity of hard mask 234 against the material that forms spacers 210, 213, and 215 such that hard mask 234 and underlying dielectric plugs 233 can remain substantially intact after the spacer etch back process.

Referring to operation 814 of FIG. 8, a seal layer is deposited on at least the top corners of openings in the semiconductor device, according to some embodiments. FIG. 5 is a cross-sectional view illustrating the semiconductor device after the seal material is deposited on at least the top corners of an opening in the semiconductor device. Seal layer 532 can be formed by a blanket deposition process followed by an etch back process. For example, a seal material is deposited on exposed top surfaces of structures in the semiconductor device, such as top surfaces of SAC 256, gate dielectric layer 218, S/D contacts 230, hard mask 234, spacers 410, 413, and 415, and other exposed top surfaces. In some embodiments, the seal layer can be deposited in openings between terminals of the semiconductor device, such as on sidewalls of spacers 410, 413, and 415 of semiconductor device 400 illustrated in FIG. 4. An etch back process can remove excessive seal material deposited on the top surfaces such that seal material can remain between the terminals to form seal material 532. In some embodiments, a planarization process can be performed such that top surfaces of SAC 256, spacers 410, 413, and 415, seal layer 532, S/D contacts 230, and hard mask 234 can be substantially coplanar (e.g., on the same horizontal plane). An air pocket entrapped by seal layer 532 can form air gaps 542 between terminals of semiconductor structure 500. For example, air gaps 542 can be formed between gate structure 208 and S/D contacts 230 in active regions 202A and between gate structure 208 and etched-back dielectric plugs 233 in inactive regions 202B. In some embodiments, air gaps 542 can include different types of air. For example, air gaps 542 can include oxygen, hydrogen, helium, argon, nitrogen, any other suitable type of air, and combinations thereof.

Seal layer 532 can be formed using any suitable dielectric material. In some embodiments, seal layer 532 can be formed using material that provides sufficient mechanical strength to support the air gap structure and chemical resistance to protect air gaps 542 from subsequent chemical processes. In some embodiments, seal layer 532 can include silicon-oxygen or silicon-carbon cross-links. In some embodiments, seal layer 452 can be deposited using radical CVD, CVD, ALD, LPCVD, UHVCVD, RPCVD, PVD, any other suitable deposition process, and combinations thereof.

Referring to operation 816 of FIG. 8, dielectric layers and interconnect structures are formed, according to some embodiments. FIG. 6 is a cross-sectional view illustrating dielectric layers and interconnect structures formed on the semiconductor device.

A dielectric layer 620 can be formed on the top surfaces of SAC 256, gate dielectric layer 218, spacers 410, 413, and 415, seal layer 532, S/D contacts 230, hard mask 234, and other suitable structures. In some embodiments, dielectric layer 620 can be an etch stop layer. Dielectric layer 620 can be formed using a low-k dielectric material (e.g., a dielectric layer having a dielectric constant lower than about 3.9), such as silicon oxide. An inter-layer dielectric (ILD) layer 650 can be formed on dielectric layer 620. ILD layer 650 can be formed of a low-k dielectric material. For example, ILD layer 650 can be formed using silicon oxide. In some embodiments, dielectric layer 620 and ILD layer 650 can be formed using CVD, ALD, PVD, flowable CVD (FCVD), sputtering, any suitable deposition process, and combinations thereof. In active regions 202A, vias can be formed in ILD 650 to establish an electrical connection from S/D contacts 230 and gate electrode 216 to external circuitry, such as peripheral circuits formed above semiconductor structure 200. Gate vias 616 can be formed in ILD 650 and extend through dielectric layer 620 to be in physical contact with contact plugs 246. In some embodiments, gate vias 616 can be in physical contact with gate electrode 216. S/D vias 630 can extend through ILD 650 and can be in physical contact with S/D contacts 230. Gate vias 616 and S/D vias 630 can be formed by a patterning and etching process. For example, openings can be formed in ILD 650 and through dielectric layer 620 to expose gate electrode 216 and S/D contacts 230, respectively. A deposition process can be performed to deposit conductive material in the openings such that electrical connections can be made. Examples of the deposition process can be PVD, sputtering, electroplating, electroless plating, any suitable deposition process, and combinations thereof. A planarization process can be performed after the deposition process such that top surfaces of ILD 650, gate vias 616, and S/D vias 630 can be substantially coplanar (e.g., level). In some embodiments, gate vias 616 and S/D vias 630 can be formed using tungsten, aluminum, cobalt, silver, any suitable conductive material, and combinations thereof. In some embodiments, vias are not formed in inactive region 202B. In some embodiments, vias can also be formed in inactive region 202B to maintain pattern density and reduce loading effects.

FIG. 7 is an enlarged view of region 602 illustrated in FIG. 6. As shown in FIG. 7, air gap 542 is surrounded by seal layer 532 and spacers 410 and 415. In some embodiments, bottom surface 532A of seal layer 532 can be at a horizontal level that is above the horizontal level of bottom surface 256A of SACs 256 by a distance $T_1$. In some embodiments, bottom surface 234A of hard mask 234 can be above the horizontal level of bottom surface 532A of seal layer 532 by a distance $T_2$. In some embodiments, a ratio of $T_1$ over $T_2$ can be between about 0.1 and about 10. For example, the ratio can be between about 0.1 and about 2, between 2 and about 4, between 4 and about 10. A lower ratio of $T_1$ over $T_2$ can provide the benefit of, among others, a seal layer 532 that extends deeper into air gap 542 and provide greater mechanical strength.

Various embodiments of the present disclosure provide simple and cost-effective structures and process for protecting dielectric plugs in semiconductor devices with air gap spacers. A hard mask layer formed using silicon oxide carbide can be formed on dielectric plugs to protect the underlying dielectric plugs during various fabrication steps, such as a spacer etch back process. The hard mask layer can have a material that has high etch selectivity against the spacer material. For example, the hard mask layer can be formed of silicon oxycarbide. In some embodiments, increasing the carbon atomic percentage can increase the etching selectivity of silicon oxycarbide against spacers formed using silicon nitride.

In some embodiments, a semiconductor device includes a first terminal formed on a fin region and having a first spacer. The semiconductor device further includes a second terminal having a hard mask and a second spacer opposing the first spacer. The hard mask and the second spacer are formed using different materials. The semiconductor device also includes a seal layer formed between first and second spacers of the first and second terminals, respectively. The semiconductor device further includes an air gap surrounded by the seal layer, the fin region, and the first and second spacers.

In some embodiments, a semiconductor device includes an inactive region that includes a first gate electrode formed on a fin and a dielectric plug structure. The inactive region also includes a hard mask on the dielectric plug structure and a first spacer in contact with a sidewall of the dielectric plug structure and with a sidewall of the hard mask. The first spacer and the hard mask are formed of different materials. The semiconductor device also includes an active region that includes a second gate electrode formed on the fin and a source/drain (S/D) contact. The active region also includes a second spacer on a sidewall of the S/D contact. The second spacer and the hard mask are formed of different materials.

In some embodiments, a method includes forming a gate electrode and a source/drain contact over a top surface of a fin region and forming first and second spacers on sidewalls of the gate electrode and the source/drain contact, respectively. The method also includes removing the source/drain contact and forming a dielectric plug in place of the source/drain contact. The method further includes forming an opening between the first and second spacers and etching back the dielectric plug to form an etched-back dielectric plug. The method also includes depositing a hard mask on the etched-back dielectric plug. The hard mask and the second spacer include different materials. The method also includes etching back the first and second spacers to form etched-back first and second spacers, respectively. The method also includes depositing a seal layer in the opening and between the etched-back first and second spacer such that air gaps are formed and surrounded by the seal layer, the etched-back first and second spacers, and the fin region.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
   forming a gate electrode and a source/drain contact over a top surface of a fin region;
   forming first and second spacers on sidewalls of the gate electrode and the source/drain contact, respectively;
   removing the source/drain contact;
   forming a dielectric plug in place of the source/drain contact;
   forming an opening between the first and second spacers;
   etching back the dielectric plug to form an etched-back dielectric plug;
   depositing a hard mask on the etched-back dielectric plug, wherein the hard mask and the second spacer comprise different materials;
   etching back the first and second spacers to form etched-back first and second spacers, respectively; and
   depositing a seal layer in the opening and between the etched-back first and second spacer to form air gaps surrounded by the seal layer, the etched-back first and second spacers, and the fin region.

2. The method of claim 1, wherein forming the first and second spacers comprise depositing silicon nitride.

3. The method of claim 1, wherein depositing the hard mask comprises depositing silicon oxycarbide.

4. The method of claim 1, wherein depositing the hard mask comprises depositing a material having a carbon content between about 5% and about 20%.

5. The method of claim 1, wherein forming the opening comprises removing a third spacer between the first and second spacers.

6. A method, comprising:
   forming a gate structure and a source/drain contact;
   forming first and second spacers on sidewalls of the gate structure and the source/drain contact, respectively;
   forming a third spacer in contact with the first and second spacers;
   replacing the source/drain contact with a dielectric structure, wherein the dielectric structure is in contact with the second spacer;
   depositing a hard mask on the dielectric structure, wherein the hard mask and the second spacer comprise different materials;
   removing the third spacer to form an opening between the first and second spacers; and
   depositing a seal layer in the opening and between the first and second spacers to form an air gap between the first and second spacers.

7. The method of claim 6, wherein forming the first and second spacers comprise depositing silicon nitride.

8. The method of claim 6, wherein depositing the hard mask comprises depositing silicon oxycarbide.

9. The method of claim 6, further comprising etching back the dielectric structure.

10. The method of claim 6, wherein removing the third spacer is performed after depositing the hard mask.

11. The method of claim 6, further comprising etching back the first and second spacers to form etched-back first and second spacers, respectively.

12. The method of claim 11, wherein etching back the first and second spacers comprises forming sloped sidewalls on the etched-back first and second spacers.

13. The method of claim 6, wherein depositing the hard mask comprises depositing a material having a carbon content between about 5% and about 20%.

14. The method of claim 6, wherein forming the first spacer comprises:
    depositing a first portion of the first spacer on a fin; and
    depositing a second portion of the first spacer on the sidewall of the gate structure.

15. The method of claim 14, wherein forming the second spacer comprises depositing the second spacer on the first portion of the first spacer.

16. A method, comprising:
    forming a gate structure and a source/drain contact on a fin;
    forming a first spacer, comprising:
       depositing a first portion of the first spacer on the fin; and
       depositing a second portion of the first spacer on a sidewall of the gate structure;
    forming a second spacer in contact with the first portion of the first spacer and a sidewall of the source/drain contact;
    forming a third spacer in contact with the first and second portions of the first spacer and the second spacer;

replacing the source/drain contact with a dielectric structure, wherein the dielectric structure is in contact with the second spacer;

depositing a hard mask on the dielectric structure, wherein the hard mask and the second spacer comprise different materials;

removing the third spacer to form an opening between the first and second spacers;

depositing a seal layer in the opening and between the first and second spacers to form an air gap between the first and second spacers; and depositing a dielectric layer on the seal layer and the hard mask.

17. The method of claim 16, further comprising performing a planarization process on the seal layer and the hard mask.

18. The method of claim 16, wherein depositing the hard mask comprises depositing silicon oxycarbide.

19. The method of claim 16, further comprising etching back the dielectric structure.

20. The method of claim 16, wherein removing the third spacer is performed after depositing the hard mask.

\* \* \* \* \*